United States Patent
Chilcote et al.

(10) Patent No.: US 6,597,553 B2
(45) Date of Patent: Jul. 22, 2003

(54) SHORT CIRCUIT PROTECTION FOR A HIGH OR LOW SIDE DRIVER WITH LOW IMPACT TO DRIVER PERFORMANCE

(75) Inventors: Jason M. Chilcote, Frisco, TX (US); Peter G. Hancock, Plano, TX (US)

(73) Assignee: Honeywell International Inc., Morristown, NJ (US)

( * ) Notice: Subject to any disclaimer, the term of this patent is extended or adjusted under 35 U.S.C. 154(b) by 29 days.

(21) Appl. No.: 10/026,752

(22) Filed: Dec. 18, 2001

(65) Prior Publication Data

US 2003/0112566 A1 Jun. 19, 2003

(51) Int. Cl.[7] .................................................. H02H 3/20
(52) U.S. Cl. ....................................................... 361/88
(58) Field of Search ........................... 361/88, 90, 93.1, 361/94

(56) References Cited

U.S. PATENT DOCUMENTS

| | | |
|---|---|---|
| 4,214,236 A | 7/1980 | Carp et al. |
| 4,276,487 A | 6/1981 | Arzubi et al. |
| 4,394,148 A | 7/1983 | Ryan |
| 4,698,582 A | 10/1987 | Braun et al. |
| 4,771,357 A | 9/1988 | Lorinez et al. |
| 4,831,283 A | 5/1989 | Newton |
| 4,884,165 A | 11/1989 | Kong et al. |
| 4,937,469 A | 6/1990 | Larson et al. |
| 4,945,358 A | 7/1990 | Wrzesinski |
| RE33,941 E | 5/1992 | Lorincz et al. |
| 5,428,492 A | 6/1995 | Swonger |
| 5,432,665 A | 7/1995 | Hopkins |
| 5,457,364 A | 10/1995 | Bilotti et al. |
| 5,696,658 A | 12/1997 | Pietrobon |
| 5,757,601 A | 5/1998 | Macks |
| 6,008,972 A | 12/1999 | Pietrobon |
| 6,347,028 B1 * | 2/2002 | Hausman, Jr. et al. ..... 361/93.1 |

* cited by examiner

Primary Examiner—Edward H. Tso
(74) Attorney, Agent, or Firm—Kris T. Fredrick

(57) ABSTRACT

A voltage driver having a pass transistor using a sensing diode and disabling transistor to sense and disable the driver during a short circuit condition. No current sense resistors or other devices in series with the pass transistor are used. During a short circuit condition, the collector-emitter (or drain-source) voltage of the pass transistor prevents the sensing diode from conducting which causes the disabling transistor to remove the control signal to the pass transistor. This latches the driver output off, protecting the driver from the short circuit condition. Recycling the control signal unlatches the protection, allowing another attempt to turn on the driver.

17 Claims, 7 Drawing Sheets

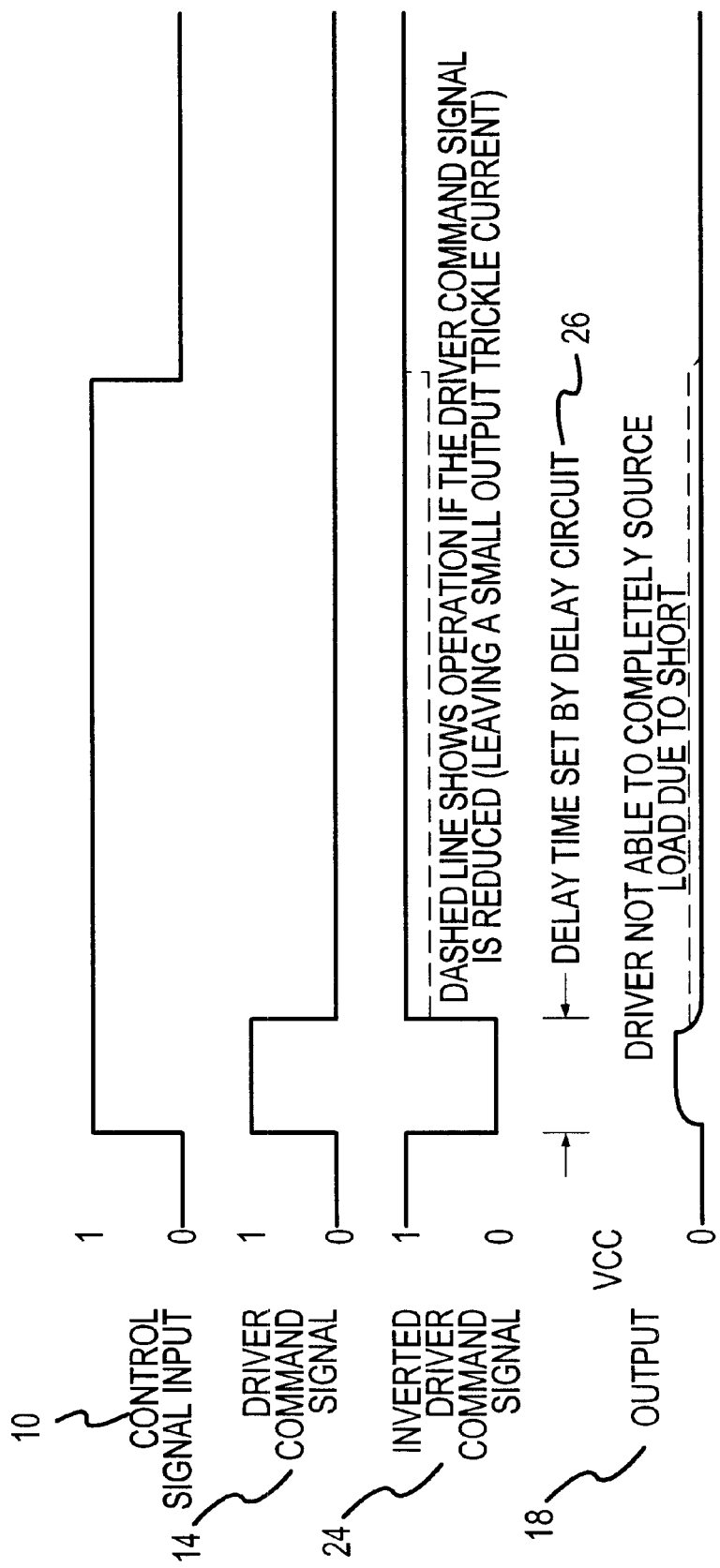

SHORT CIRCUIT PROTECTION FOR A HIGH OR LOW SIDE DRIVER WITH LOW IMPACT TO DRIVER PERFORMANCE

BACKGROUND OF THE INVENTION

1. Field of the Invention (Technical Field)

The present invention relates to short circuit protection mechanisms and more particularly short circuit protection in general high and low side voltage driver circuits implemented in an integrated circuit's output driver.

2. Background Art

There has been a need for a minimal impact load short circuit protection apparatus for a high and low side driver that does not affect or degrade the driver output performance. The present state of the art calls for expensive solutions, and due to increased number of components, the solutions take up an inordinate amount of circuit area.

Most circuits use a series current sense resistor, and disable the driver if the voltage developed across the resistor exceeds a predetermined value. This is sometimes done in an analog fashion such as with a series emitter resistance that cuts back the current or done digitally using a comparator. The current sense resistor can be costly, depending on performance required, and generally penalizes the design by increasing power dissipation, saturation voltage, output resistance and decreasing in-rush current capability, rise/fall times, and reliability.

There are several prior art drivers that are able to withstand short circuit conditions and include this expensive solution. The device disclosed in U.S. Pat. No. 4,698,582 eliminates the need for a current sense resistor, but measures the output transistor's base-emitter voltage (instead of collector-emitter voltage) and uses costly comparator, reference, and latching circuitry. The following patents also disclose using a series resistor: U.S. Pat. Nos. 6,008,972, 5,757,601, 5,696,658, 5,457,364, 4,771,357 and U.S. Pat. No. RE33,941. U.S. Pat. No. 5,432,665 teaches using multiple pass transistors with different amounts of series resistance. A low resistance transistor is used for initial switching, and the high resistance transistor is used if the output state does not change (i.e. short circuit). U.S. Pat. No. 4,945,358 uses a parallel resistor and inductor, impacting the driver's performance, including cost as well as leakage current in this case. The device disclosed in U.S. Pat. No. 4,394,148 does not turn off during a short circuit. The pass transistor is sized to handle short circuit conditions.

State of the art approaches are more costly and/or degrade driver performance. However, none of the prior art devices protect electronic voltage driver circuits from output loads shorting while using only a small amount of circuit area. The prior art devices also significantly degrade driver output performance, which include output resistance, saturation voltage, in-rush current capability, output rise and fall times, output voltage transient immunity, power dissipation, output leakage current, and reliability.

SUMMARY OF THE INVENTION (DISCLOSURE OF THE INVENTION)

In accordance with the present invention, disclosed is method and apparatus for providing short circuit protection for a low side or high side driver without substantially impacting the driver's performance. This circuit provides short circuit protection for short circuits to ground or to VCC.

The preferred short circuit protection apparatus for an output of a high or low side driver comprises a means for constantly monitoring an output voltage, a means for comparing the monitored output voltage to a known reference voltage, a switching means for switching the output to a predetermined voltage after an actuation delay if the constantly monitored output voltage equals or exceeds the known reference voltage after said actuation delay and a delay circuit for providing said actuation delay for a period longer than a capacitive output fall time. The preferred switching means comprises a pass transistor. The predetermined voltage can be ground or VCC. The preferred means for comparing comprises a high input voltage comparator. The preferred delay circuit comprises a current source delay circuit. The preferred means for constantly monitoring and comparing the output voltage comprises a diode. The diode preferably comprises an end connected to an output.

The preferred short circuit protection apparatus for an output of a high or low side driver comprises a diode for constantly monitoring and comparing an output voltage, a comparator comprising the diode for comparing the monitored output voltage to a known reference voltage, a switch driven by the comparator for switching the output to a predetermined voltage after an actuation delay if the constantly monitored output voltage equals or exceeds the known reference voltage after the actuation delay, and a delay circuit for providing the actuation delay for a period longer than a capacitive output fall time.

The preferred method of protecting a high or low side driver from output short circuits comprises the steps of monitoring an output voltage, comparing the monitored output voltage with a known reference voltage, activating a switch to pull the output to a predetermined voltage after an actuation delay if the monitored output voltage equals or exceeds the known reference voltage and providing the actuation delay with a source delay circuit for a period longer than a capacitive output fall time. The preferred step of activating a switch comprises activating a pass transistor. The step of activating a switch to pull the output to a predetermined voltage comprises pulling the output to ground or to VCC. The preferred step of comparing comprises comparing the monitored output voltage with a known reference voltage using a high input voltage comparator. The preferred step of providing an actuation delay comprises using a current source delay circuit. The preferred step of monitoring and comparing the output voltage comprises monitoring and comparing the output voltage with a diode. The preferred step of monitoring an output voltage comprises constantly monitoring the output voltage.

A primary object of the present invention is to provide inexpensive short circuit protection to a high or low side driver without affecting driver output performance.

Another object of the present invention is to provide short circuit protection to a high or low side driver with as few components as necessary.

A primary advantage of the present invention is that it is inexpensive compared to other present systems.

Another advantage of the present invention is that it uses only a small amount of circuit area due to the elimination of components.

Yet another advantage of the present invention is the reduction of total circuit power dissipation due to the reduced number of components.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIG. 8 is a timing diagram for the circuit of FIG. 6 operating with a shorted load.

DESCRIPTION OF THE PREFERRED EMBODIMENTS (BEST MODES FOR CARRYING OUT THE INVENTION)

Figure 1:
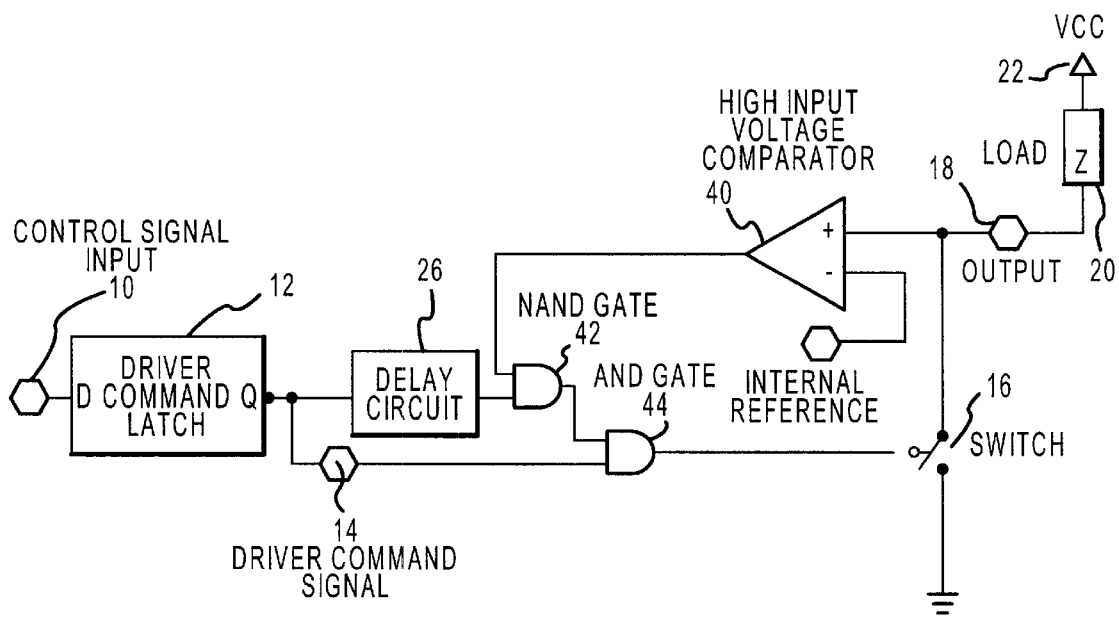
FIG. 1 is a block diagram of the preferred low side driver.
Figure 3:
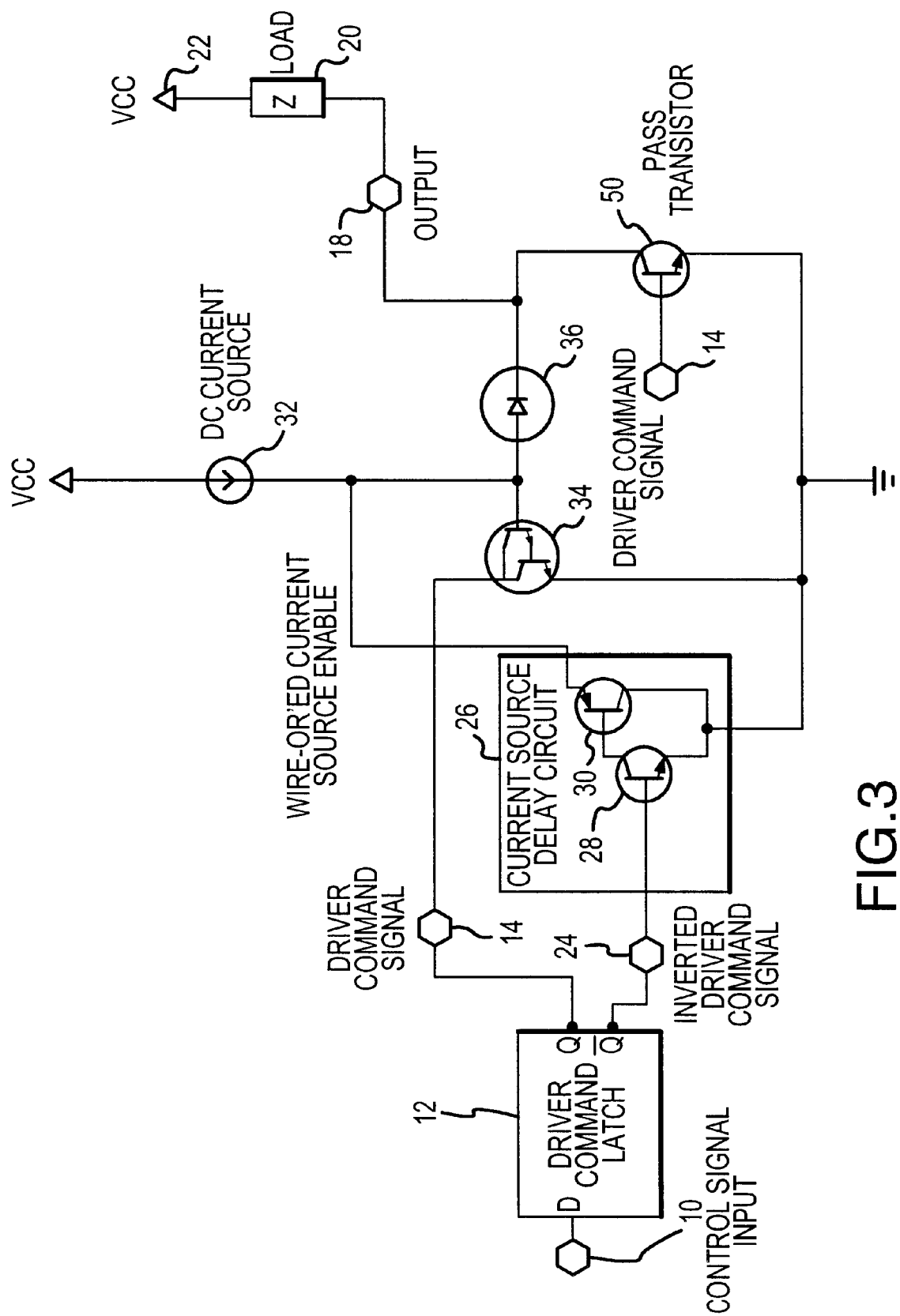
FIG. 3 is a schematic diagram of the preferred invention for a low side driver.

FIGS. 1 and 3 are a block diagram and a schematic diagram of the preferred short circuit protection for a low side driver with a low impact to driver performance. FIG. 1 generally shows how the low side short circuit protection circuit operates while FIG. 3 shows the components used in the preferred embodiment. Referring to FIGS. 1 and 3, during normal operation, the circuit begins in the off state. No current or power is applied to load 20 since switch 16, or pass transistor 50 is off. Switch 20 or pass transistor 50 is typically a bipolar transistor, FET, or the like, that is capable of withstanding the VCC's or power source's 22 voltage and the load's 20 current requirements. When driver command latch 12 receives a control signal input 10, it sets the driver command signal 14 active (high state). This in turn activates switch 16 or pass transistor 50, allowing current to flow, which pulls the connected output 18 to ground. Output 18 is connected to a load 20 which can be resistive, inductive, capacitive or any combination thereof. The other end of the load 20 is connected to a power source 22. The name "low side driver" means the circuit switches the output 18, which is the low side of the load 20, to ground. This switching of the output 18 to ground is the method of applying power to the load 20. This is a typical implementation of a low side driver.

Short circuit protection is often added to protect switch 16 or pass transistor 50 or other outside components such as wires, etc., in case the output 18 short circuits to the power source 22. Without this protection, the power dissipated in switch 16 or pass transistor 50 is usually destructive. The present invention does not utilize series limiting or sense resistors, which typically are found in prior art short circuit protection circuits.

Figure 4:
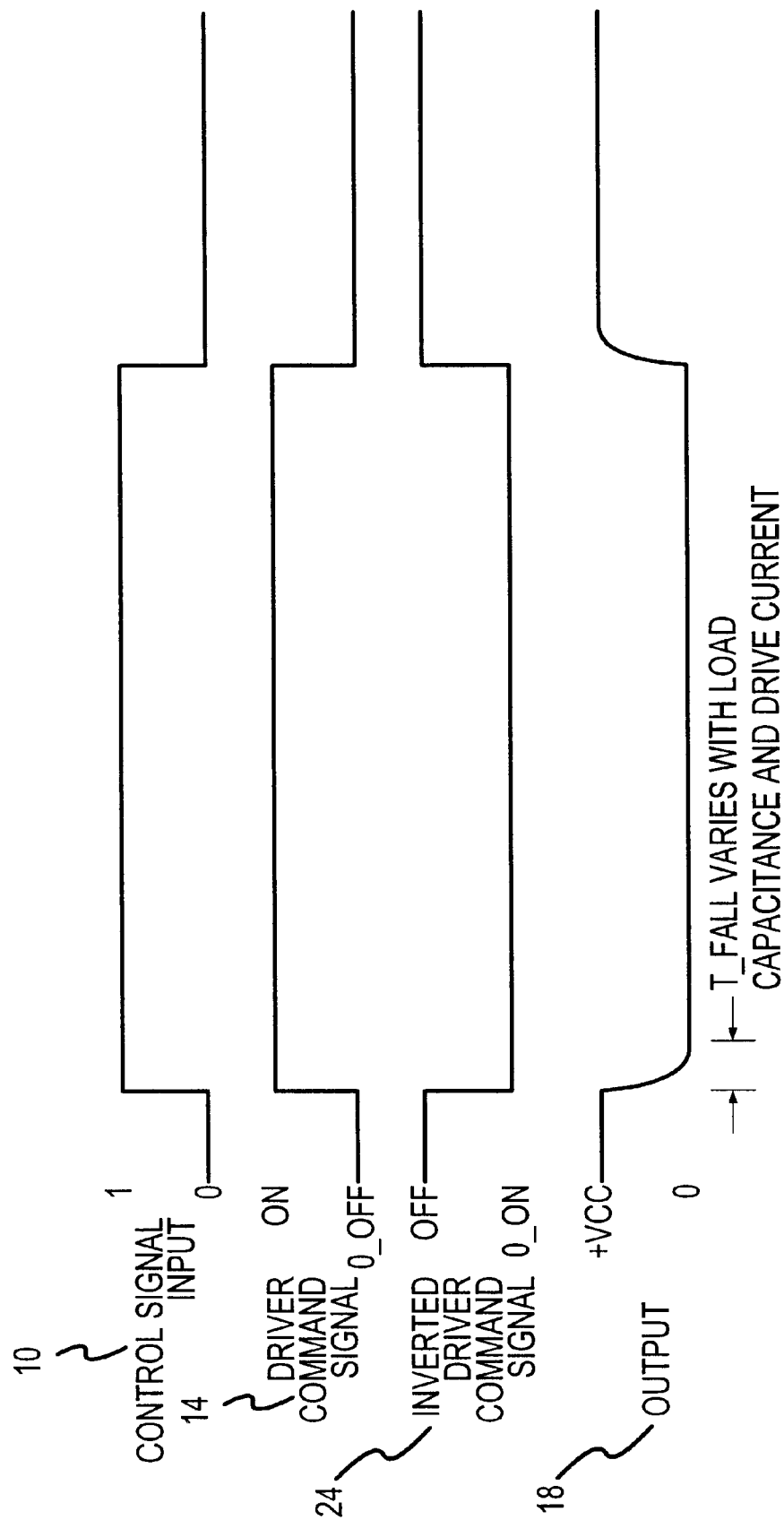
FIG. 4 is a timing diagram for the circuit of FIG. 3 operating with a normal load.

The present short circuit protection utilizes a high input voltage comparator 40 which in the preferred invention comprises a DC current source 32 which is set to be very small compared to the pass transistor's 50 drive current, a sensing diode 36 and a shutdown transistor 34. A delay circuit 26 is necessary to prevent the driver 12 from deactivating before it has time to pull output 18 low due to load capacitance. As shown in FIGS. 1 and 3, and also referring to the timing diagram of FIG. 4, beginning again in the off state, the driver command signal 14 is inactive (low) from the driver command latch 12. Logic gate 44 disables switch 16. This function is accomplished similarly in the preferred schematic diagram of FIG. 3, however, the logic and comparison functions are integrated. The inverted command signal 24 is in the inactive (high) state, which causes delay circuit 26 to sink all of the DC current source's 32 current. In this preferred implementation, saturation transistor 28 is put into saturation and turns on current source switching transistor 30, which pulls the DC current source's 32 current to ground. The preferred DC current source 32 can simply be a resistor or part of a current mirror. More complex implementations of the delay circuit 26 are possible and may be required for longer delay times. These implementations could include a simple RC network between the driver command 12 and the current source delayed enable 26 or even a digital counter to add a delay.

Once the driver command latch 12 receives control signal input 10, it sets driver command signal 14 active (high state). This in turn activates switch 16 or pass transistor 50, allowing current to flow, which pulls output 18 to ground if the load 20 is not shorted. A short time later, the delay circuit 26 deactivates. This causes the current from the DC current source 32 to flow through sensing diode 36 to output 18, which is being pulled to ground by pass transistor 50. Delay circuit 26 allows switch 16 or pass transistor 50 enough time to saturate and pull output 18 to ground. The delay time must be larger for capacitive loads with a large capacitance since it will take longer for switch 16 or pass transistor 50 to pull output 18 to ground.

Figure 5:
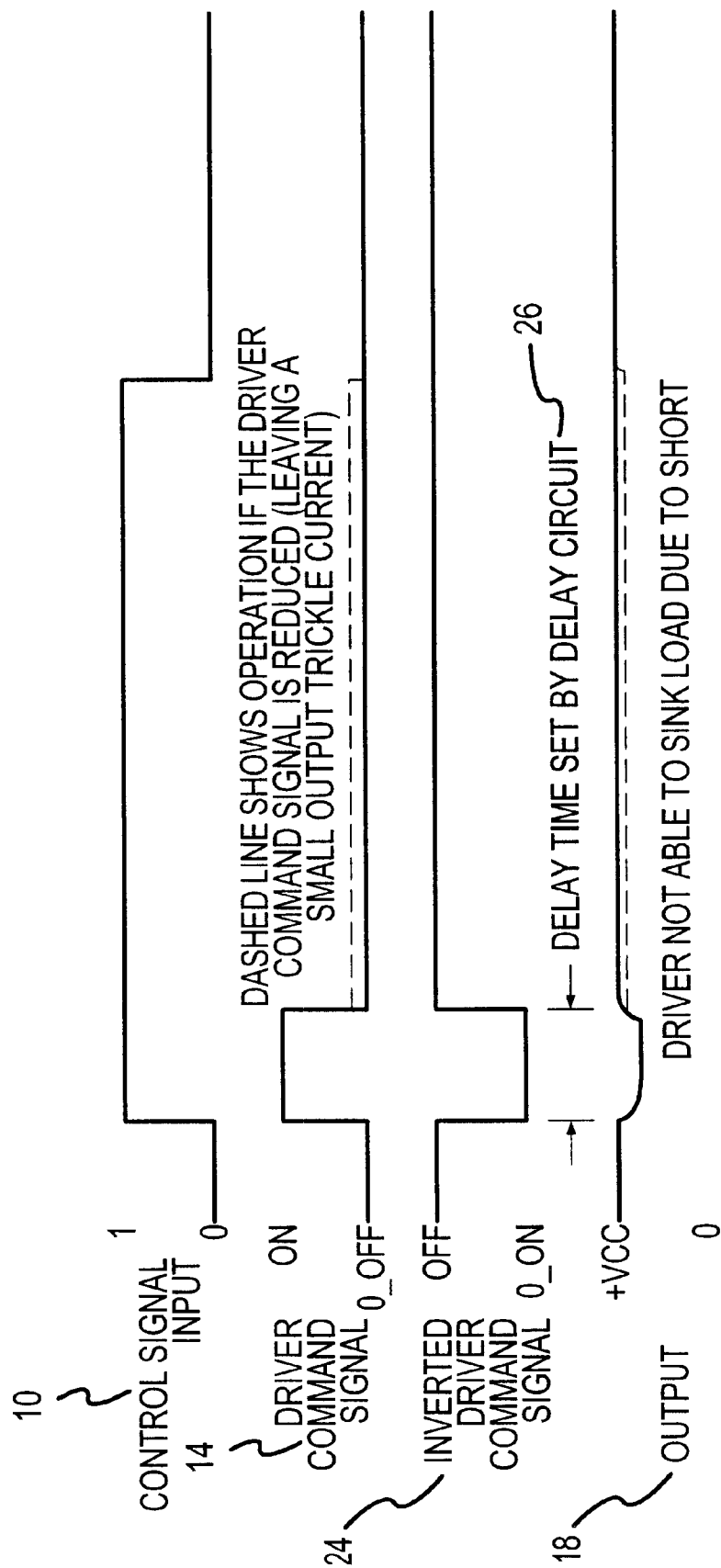
FIG. 5 is a timing diagram for the circuit of FIG. 3 operating with a shorted load.

If however, output 18 is not pulled to ground by the time the delay circuit 26 deactivates (i.e. short circuit), the high input voltage comparator 40 turns off the switch 16 through logic gates 42 and 44. Similarly, in the schematic diagram of FIG. 3, the current from the DC current source 32 will instead flow into the base of shutdown transistor 34 since sensing diode 36 will be reversed biased. This is shown in the timing diagram of FIG. 5 in conjunction with the diagrams of FIGS. 1 and 3. This base current causes a much larger collector current to flow in shutdown transistor 34, which overrides driver command signal 14 by pulling it low. Disabling driver command signal 14 disables switch 16 or pass transistor 50, protecting it against a short circuit condition. This results in a latched condition since output 18 can not be pulled low with switch 16 or pass transistor 50 disabled. Recycling of the control signal input is necessary to reset the circuit since the circuit is in itself a latch. In the schematic diagram of FIG. 3, this is accomplished by removing the base current from shutdown transistor 34 and directing it back to delay circuit 26.

Figure 2:
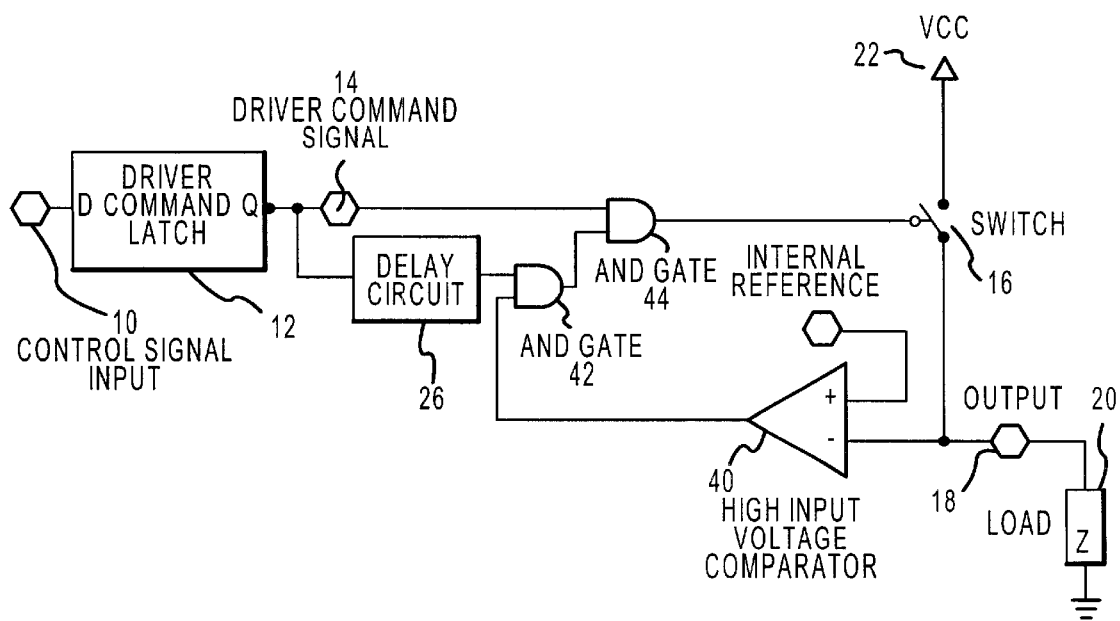
FIG. 2 is a block diagram of the preferred high side driver.
Figure 6:
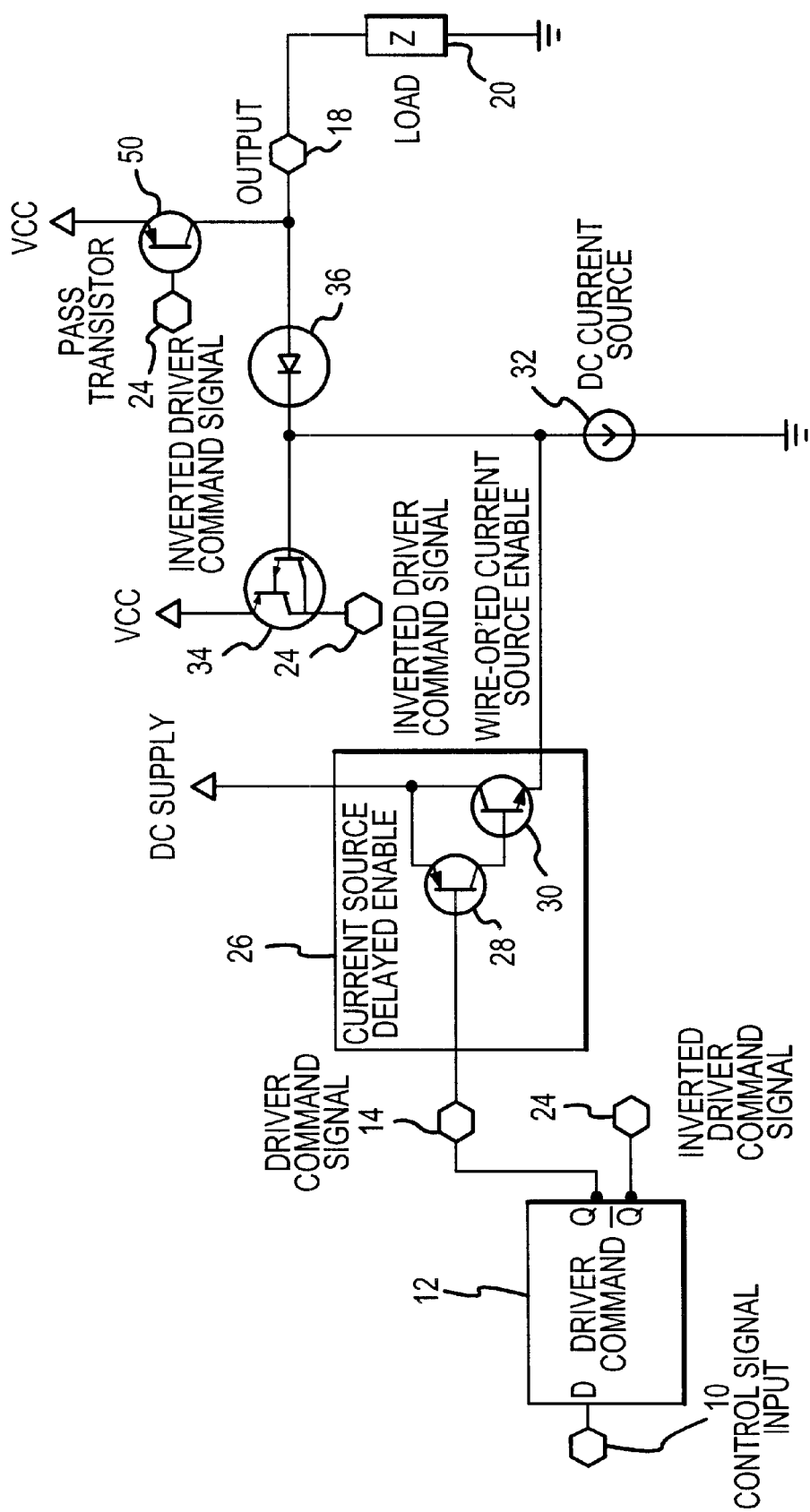
FIG. 6 is a schematic diagram of the preferred invention for a high side driver.

FIG. 2 is a block diagram and FIG. 6 is a schematic diagram of the preferred short circuit protection for a high side driver with low impact to driver performance. The high side driver operates in a similar manner as the aforementioned low side driver with some current directions reversed and some voltage polarities reversed. During normal operation, the circuit begins in the off state. No current or power is applied to load 20 since switch 16 or pass transistor 50 is off. Switch 16 or pass transistor 50 is typically a bipolar transistor, FET, or the like, that is capable of withstanding VCC and the load's 20 current requirements. When driver command latch 12 receives a control signal input 10, it sets the driver command signal 14 active. This in turn activates switch 16 or pass transistor 50 allowing current to flow, which pulls connected output 18 to VCC. Output 18 is connected to a load 20 which can be resistive, inductive, capacitive or any combination thereof. The other end of load 20 is connected to ground. The name "high side driver" means the circuit switches output 18, which is the high side of the load 20 to VCC. This switching of output 18 to VCC is the method of applying power to load 20. This is a typical implementation of a high side driver.

To accomplish short circuit protection, a high input voltage comparator 40 is again utilized. In the preferred invention this comprises a DC current source 32 which is set to be very small compared to pass transistor's 50 drive current, a sensing diode 36, a shutdown transistor 34, and a delay circuit 26. The operation of the circuit in FIG. 2 is the same as FIG. 1 with the input polarity of the high voltage comparator 40 being reversed, with similar operational differences between FIG. 3 and FIG. 6. Beginning again in the off state, inverted driver command signal 24 is inactive (high) from driver command latch 12. Driver command signal 14 is in the inactive (low) state, which causes delay circuit 26 to source all of the DC current source's 32 current. In this preferred implementation, this occurs because saturation transistor 28 is put into saturation and turns on the current source switching transistor 30, which sources the DC current source's 32 current. DC current source 32 can simply be a resistor or part of a current mirror. More complex implementations of the delay circuit 26 are possible and may be required for a longer delay. These implementations could include a simple RC network between the driver command 12 and the current source delayed enable 26 or even a digital counter to add a delay.

Figure 7:
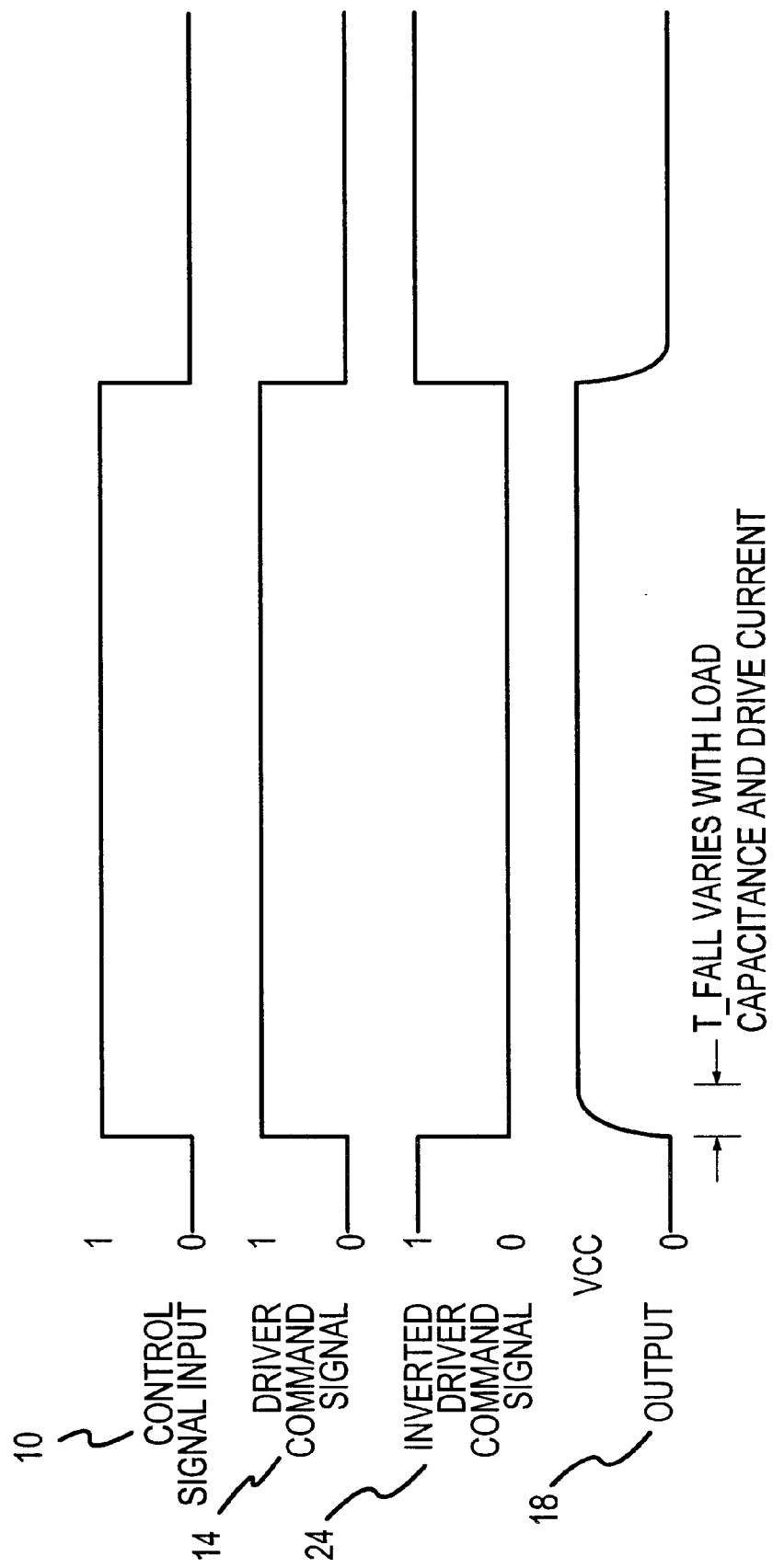
FIG. 7 is a timing diagram for the circuit of FIG. 6 operating with a normal load.

As shown in FIGS. 2 and 6 in conjunction with FIG. 7, once driver command latch 12 receives control signal input 10, it sets inverted driver command signal 24 active (low state). This in turn activates switch 16 or pass transistor 50 allowing current to flow, which pulls output 18 to VCC if load 20 is not shorted. A short time later, delay circuit 26 deactivates. This causes the current from the DC current source 32 to flow from sensing diode 36 from output 18, which is being pulled to VCC by switch 16 or pass transistor 50. Delay circuit 26 allows switch 16 or pass transistor 50 enough time to saturate and pull output 18 to VCC. The delay time must be larger for loads with a large capacitance since it will take longer for pass transistor 50 to pull output 18 to VCC.

If however, output 18 is not pulled to VCC by the time delay circuit 26 deactivates (i.e. short circuit), the current from the DC current source 32 will instead flow from the base of shutdown transistor 34, since sensing diode 36 will be reversed biased. This is shown in FIG. 8 in conjunction with FIGS. 2 and 6. This base current causes a much larger collector current to flow in shutdown transistor 34, which overrides driver command signal 14 by pulling it high. Disabling driver command signal 14 disables switch 16 or pass transistor 50, protecting it against a short circuit condition. This results in a latched condition since output 18 can not be pulled high with switch 16 or pass transistor 50 disabled. Recycling of the control signal input 10 is necessary to reset the circuit since this removes the base current from shutdown transistor 34 and directs it back to delay circuit 26.

The short circuit trip point is the voltage level that switch 16 or pass transistor 50 has to pull output 18 to in order,for the driver to remain enabled. In either the low side driver or high side driver implementation, the short circuit trip point can be modified by changing the voltage at the emitter of shutdown transistor 34. In this implementation the short circuit trip point is one diode voltage drop from ground for the low side driver (one diode drop from VCC or the high side driver). By adding another diode in series with the emitter of shutdown transistor 34, the short circuit trip point would be increased to two diode voltage drops (not shown).

The components for the preferred embodiments as shown in FIGS. 3 and 6 comprise a sensing diode 36 with one end connected to output 18 and the other end connected to DC current source 32. A shutdown transistor 34 with base connected to DC current source 32; collector used to directly or indirectly disable the command; and emitter connected to ground, VCC, or other reference to adjust the short circuit voltage trip point. In the preferred implementation, this transistor can be a Darlington, although most generic transistors will work. A Darlington transistor is well suited for this application since it has very high gain and an extra diode voltage drop is necessary at its base before it is activated making the trip point at one diode drop without any extra diodes in series with the emitter. A delay circuit 26 which sinks (or sources) current from (or to) DC current source 32 when the driver is commanded off and for a short time after it is commanded on. A DC current source 32 providing current that flows through either sensing diode 36, shutdown transistor 34, or delay circuit 26 depending on the command state and the state of the output.

A filter circuit between output 18 and the sense diode 36 can be added to reduce the effects of noise on output 18 after the driver is turned on (not shown). In an alternative embodiment, the shutdown transistor 34 does not necessarily have to completely disable driver command signal 14. Instead, driver command signal 14 can be reduced to a point where pass transistor 50 operates at a safe current during the short circuit. This way the driver may recover after the short circuit is removed (not shown).

In yet another alternative embodiment, shutdown transistor 34 could be implemented using a FET. The short circuit trip point would then be a function of the FET's threshold voltage minus a diode drop.

Capacitive load switching after the driver is turned on may result in the driver being latched off. In this case control signal input 10 can be recycled to turn the driver back on. A filter circuit may be added between the output 18 and the sensing diode 36 to eliminate this problem.

The present invention can be incorporated into any circuit utilizing a high or low side driver such as in an automotive transmission sensor's low side driver circuit. Other similar uses include magnetic speed, position and direction sensors and various electronic controllers used in engines, automobiles, aircraft, and the like.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, are hereby incorporated by reference.

What is claimed is:

1. A short circuit protection apparatus for an output of a high or low side driver, the apparatus comprising;

a means for monitoring an output voltage;

a means for comparing the monitored output voltage to a known reference voltage;

a switching means for switching the output to a predetermined voltage after an actuation delay if the constantly monitored output voltage equals or exceeds the known reference voltage after said actuation delay; and a delay circuit for providing said actuation delay for a period longer than a capacitive output fall time.

2. The invention of claim 1 wherein said switching means comprises a pass transistor.

3. The invention of claim 1 wherein said predetermined voltage comprises ground.

4. The invention of claim 1 wherein said predetermined voltage comprises VCC.

5. The invention of claim 1 wherein said means for comparing comprises a high input voltage comparator.

6. The invention of claim 1 wherein said delay circuit comprises a current source delay circuit.

7. The invention of claim 1 wherein said means for monitoring and comparing the output voltage comprises a diode.

8. The invention of claim 7 wherein said diode comprises an end connected to an output.

9. A short circuit protection apparatus for an output of a high or low side driver, the apparatus comprising;

a diode for constantly monitoring an output voltage;

a comparator comprising said diode for comparing the monitored output voltage to a known reference voltage;

a switch driven by said comparator for switching the output to a predetermined voltage after an actuation delay if the constantly monitored output voltage equals or exceeds the known reference voltage after said actuation delay; and a delay circuit for providing said actuation delay for a period longer than a capacitive output fall time.

10. A method of protecting a high or low side driver from output short circuits, the method comprising the steps of:

monitoring an output voltage;

comparing the monitored output voltage with a known reference voltage;

activating a switch to pull the output to a predetermined voltage after an actuation delay if the monitored output voltage equals or exceeds the known reference voltage; and providing the actuation delay with a source delay circuit for a period longer than a capacitive output fall time.

11. The method of claim 10 wherein the step of activating a switch comprises activating a pass transistor.

12. The method of claim 10 wherein the step of activating a switch to pull the output to a predetermined voltage comprises pulling the output to ground.

13. The method of claim 10 wherein the step of activating a switch to pull the output to a predetermined voltage comprises pulling the output to VCC.

14. The method of claim 10 wherein the step of comparing comprises comparing the monitored output voltage with a known reference voltage using a high input voltage comparator.

15. The method of claim 10 wherein the step of providing an actuation delay comprises using a current source delay circuit.

16. The method of claim 10 wherein the step of monitoring and comparing the output voltage comprises monitoring and comparing the output voltage with a diode.

17. The method of claim 10 wherein the step of monitoring an output voltage comprises constantly monitoring the output voltage.

\* \* \* \* \*